(12) United States Patent
Chan et al.

(10) Patent No.: US 8,963,238 B2
(45) Date of Patent: Feb. 24, 2015

(54) DOUBLE DIFFUSED DRAIN METAL-OXIDE-SEMICONDUCTOR DEVICES WITH FLOATING POLY THEREON AND METHODS OF MANUFACTURING THE SAME

(71) Applicant: Macronix International Co., Ltd., Hsin-Chu (TW)

(72) Inventors: Wing Chor Chan, Hsin-Chu (TW); Chih-Min Hu, Kaohsiung (TW); Shyi-Yuan Wu, Hsin-Chu (TW); Jeng Gong, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 14/190,941

(22) Filed: Feb. 26, 2014

(65) Prior Publication Data

US 2014/0175544 A1 Jun. 26, 2014

Related U.S. Application Data

(63) Continuation of application No. 12/786,984, filed on May 25, 2010, now Pat. No. 8,698,240.

(51) Int. Cl.
*H01L 29/78* (2006.01)
*H01L 21/762* (2006.01)
(Continued)

(52) U.S. Cl.
CPC ...... *H01L 29/7833* (2013.01); *H01L 21/76232* (2013.01); *H01L 21/823418* (2013.01); *H01L 21/823468* (2013.01); *H01L 21/823481* (2013.01); *H01L 29/0847* (2013.01);
(Continued)

(58) Field of Classification Search
USPC ......... 257/335–343, 206, 350, 351, 357–359, 257/369, 371–377, 340
See application file for complete search history.

(56) References Cited

U.S. PATENT DOCUMENTS

| 5,545,575 A | 8/1996 | Cheng et al. |
| 5,900,657 A | 5/1999 | Merrill |

(Continued)

FOREIGN PATENT DOCUMENTS

TW 201143090 A 12/2011

OTHER PUBLICATIONS

United States Patent and Trademark Office, Office Action for U.S. Appl. No. 12/786,984, mailed Jul. 25, 2012, USA.

(Continued)

*Primary Examiner* — Steven J Fulk
*Assistant Examiner* — Eric Ward
(74) *Attorney, Agent, or Firm* — Alston & Bird LLP

(57) ABSTRACT

A metal-oxide-semiconductor (MOS) device is disclosed. The MOS device includes a substrate of a first impurity type, a diffused region of a second impurity type in the substrate, a patterned first dielectric layer including a first dielectric portion over the diffused region, a patterned first conductive layer on the patterned first dielectric layer, the patterned first conductive layer including a first conductive portion on the first dielectric portion, a patterned second dielectric layer including a second dielectric portion that extends on a first portion of an upper surface of the first conductive portion and along a sidewall of the first conductive portion to the substrate; and a patterned second conductive layer on the patterned second dielectric layer, the patterned second conductive layer including a second conductive portion on the second dielectric portion.

16 Claims, 6 Drawing Sheets

(51) Int. Cl.
*H01L 21/8234* (2006.01)
*H01L 29/08* (2006.01)
*H01L 29/40* (2006.01)
*H01L 29/423* (2006.01)
*H01L 29/66* (2006.01)

(52) U.S. Cl.
CPC ............ *H01L29/402* (2013.01); *H01L 29/423* (2013.01); *H01L 29/66575* (2013.01); *H01L 29/66659* (2013.01); *H01L 29/7835* (2013.01)
USPC .................... 257/338; 257/369; 257/E29.256

(56) References Cited

U.S. PATENT DOCUMENTS

| | | |
|---|---|---|
| 5,989,966 A | 11/1999 | Huang |
| 6,118,157 A * | 9/2000 | Bergemont .................. 257/366 |
| 6,197,673 B1 | 3/2001 | Yu |
| 6,512,273 B1 | 1/2003 | Krivokapic et al. |
| 6,727,534 B1 | 4/2004 | Buller et al. |
| 6,828,183 B1 | 12/2004 | Sung et al. |
| 7,196,375 B2 * | 3/2007 | Chen et al. .................... 257/336 |
| 7,247,909 B2 * | 7/2007 | Chen et al. .................... 257/336 |
| 7,279,744 B2 * | 10/2007 | Gammel et al. ............. 257/335 |
| 7,282,410 B2 * | 10/2007 | Lu et al. ....................... 438/257 |
| 7,521,768 B2 * | 4/2009 | Theeuwen et al. ........... 257/408 |
| 2007/0187784 A1 | 8/2007 | Wu et al. |
| 2008/0237705 A1 * | 10/2008 | Theeuwen et al. ........... 257/343 |
| 2009/0032868 A1 | 2/2009 | Chen et al. |
| 2009/0166755 A1 | 7/2009 | Chakravarthi et al. |
| 2011/0291187 A1 | 12/2011 | Chan et al. |

OTHER PUBLICATIONS

United States Patent and Trademark Office, Office Action for U.S. Appl. No. 12/786,984, mailed Jan. 30, 2013, USA.
United States Patent and Trademark Office, Office Action for U.S. Appl. No. 12/786,984, mailed Aug. 16, 2013, USA.
United States Patent and Trademark Office, Notice of Allowance and Fees Due for U.S. Appl. No. 12/786,984, mailed Nov. 27, 2013, USA.

* cited by examiner

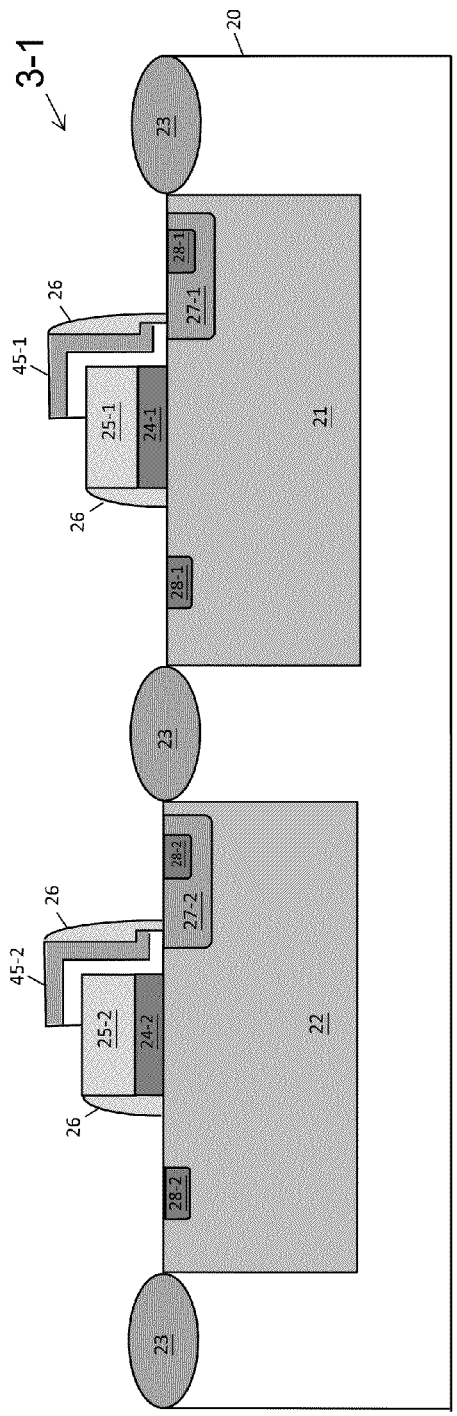
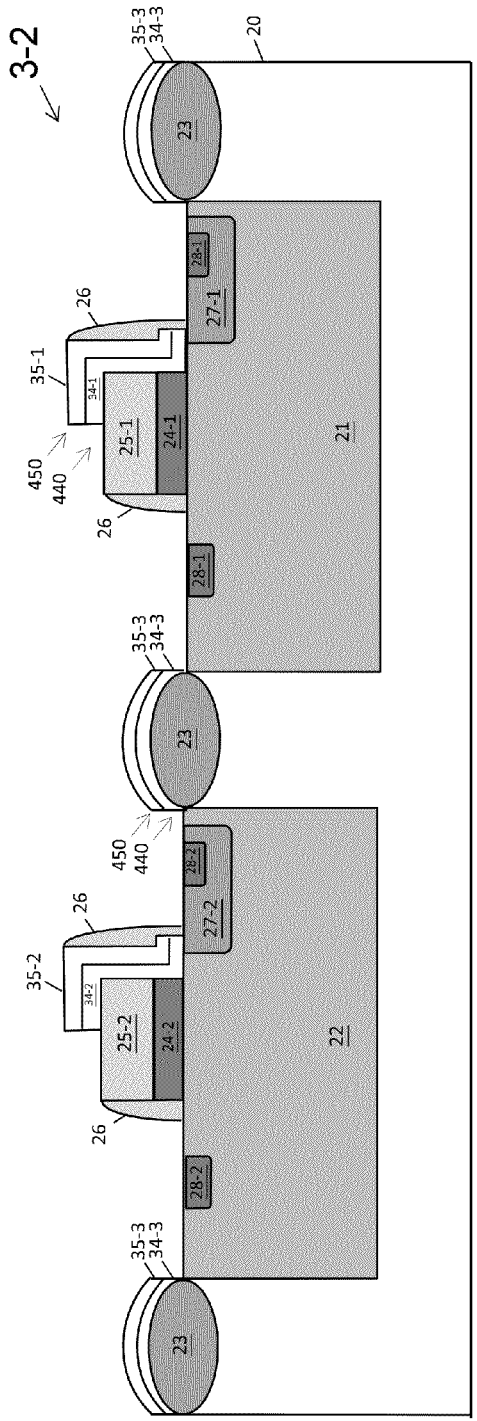
FIG. 3A
FIG. 3B

DOUBLE DIFFUSED DRAIN METAL-OXIDE-SEMICONDUCTOR DEVICES WITH FLOATING POLY THEREON AND METHODS OF MANUFACTURING THE SAME

CROSS-REFERENCE TO RELATED APPLICATIONS

This application is a continuation of U.S. application Ser. No. 12/786,984, filed May 25, 2010, which is hereby incorporated herein in its entirety by reference.

BACKGROUND OF THE INVENTION

The present invention generally relates to a metal-oxide-semiconductor (MOS) device and, more particularly, to a double diffused drain (DDD) MOS device with a floating poly thereon and a method of fabricating the same Serving as elements of the power ICs, the MOS devices have to possess the capability of sustaining high operating voltage. To sustain high operating voltage, however, the distance between the gate and drain of a conventional MOS device generally has to be kept large enough, which may hinder the MOS device from downsizing, as will be discussed below.

FIGS. 1A and 1B are schematic cross-sectional views illustrating a MOS device 1-1 in prior art. Referring to FIG. 1A, the MOS device 1-1 may include a p-type substrate 10, a plurality of first isolation structures 13 on the substrate 10, an n-well region 11 and a p-well region 12 within the substrate 10, a high-voltage "p" minus (HVPM) region 17-1 within the n-well region 11, a pair of p+ regions 18-1 with one in the HVPM region 17-1 and the other one in the n-well region 11, a high-voltage "n" minus (HVNM) region 17-2 within the p-well region 12, and a pair of n+ regions 18-2 with one in the HVNM region 17-2 and the other one in the p-well region 12. Furthermore, the MOS device 1-1 includes a patterned dielectric layer on the substrate 11, wherein the patterned dielectric layer comprises a first portion 14-1 and a second portion 14-2, and a patterned conductive layer on the patterned dielectric layer, wherein the patterned conductive layer comprises a first portion 15-1 and a second portion 15-2. A plurality of second isolation structures 16 may be formed along the sidewalls of the patterned dielectric layer and the patterned conductive layer.

The MOS device 1-1 may serve as an element in power management integrated circuits (PMICs) and operate at a relatively high voltage such as 12 volts (V). In some applications, the distance $W_0$ between the gate, i.e., the first portion 15-1 of the patterned conductive layer and the drain, i.e., the p+ region 18-1 in the NVPM region 17-1 may be 1.2 micrometers (μm) or greater so as to sustain such a high voltage. Moreover, the higher the operating voltage, the greater the distance $W_0$. For example, as the MOS device 1-1 operates at a voltage of 16V, the distance $W_0$ may be increased to 1.5 μm. Furthermore, as the MOS device 1-1 operates at a much higher voltage, for example, 800V, the distance $W_0$ may be increased up to 80 μm.

Referring to FIG. 1B, a MOS device 1-2 may be similar to the MOS device 1-1 described and illustrated with reference to FIG. 1A except that, for example, the MOS device 1-2 includes a pair of HVPM regions 17-1 and 19-1 and a pair of HVNM regions 17-2 and 19-2. The MOS device 1-2 has the same issue as the MOS device 1-1 and similarly may have difficulty in downsizing.

It may therefore be desirable to have a MOS device that is capable of sustaining high operating voltage without significantly increasing the gate-to-drain distance $W_0$.

BRIEF SUMMARY OF THE INVENTION

Examples of the present invention may provide a metal-oxide-semiconductor (MOS) device. The MOS device includes, a diffused region including a first portion of a second impurity type and a second portion of a first impurity type in the substrate, a patterned first dielectric layer including a first dielectric portion over the first portion of the diffused region and a second dielectric portion over the second portion of the diffused portion, a patterned first conductive layer on the patterned first dielectric layer, the patterned first conductive layer including a first conductive portion on the first dielectric portion and a second conductive portion on the second dielectric portion, a patterned second dielectric layer including a third dielectric portion that extends on the first conductive portion and along a sidewall of the first conductive portion to the substrate, and a fourth dielectric portion that extends on the second conductive portion and along a sidewall of the second conductive portion to the substrate, and a patterned second conductive layer on the patterned second dielectric layer, the patterned second conductive layer including a third conductive portion on the third dielectric portion and a fourth conductive portion on the fourth dielectric portion.

Some examples of the present invention may provide a MOS device that includes a diffused region including a first portion of a second impurity type and a second portion of a first impurity type in the substrate, a patterned first dielectric layer including a first dielectric portion over the first portion of the diffused region, a patterned first conductive layer on the patterned first dielectric layer, the patterned first conductive layer including a first conductive portion on the first dielectric portion, a patterned second dielectric layer including a second dielectric portion that extends on a first portion of an upper surface of the first conductive portion and along a sidewall of the first conductive portion to the substrate, and a patterned second conductive layer on the patterned second dielectric layer, the patterned second conductive layer including a second conductive portion on the second dielectric portion.

Examples of the present invention may also provide a MOS that includes a diffused region including a first portion of a second impurity type and a second portion of a first impurity type in the substrate, a patterned first dielectric layer including a first dielectric portion over the first portion of the diffused region, a patterned first conductive layer on the patterned first dielectric layer, the patterned first conductive layer including a first conductive portion on the first dielectric portion, a patterned second dielectric layer including a second dielectric portion that extends on the first conductive portion and along a first sidewall of the first conductive portion to the substrate, and a third dielectric portion that extends on the first conductive portion and along a second sidewall of the first conductive portion to the substrate, the second and third dielectric portions separated from each other on the first conductive portion, and a patterned second conductive layer on the patterned second dielectric layer, the patterned second conductive layer including a second conductive portion on the second dielectric portion and a third conductive portion on the third dielectric portion.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings:

FIG. 3A is a schematic cross-sectional view of a DDD MOS device in accordance with an example of the present invention;

FIG. 3B is a schematic cross-sectional view of a DDD MOS device in accordance with another example of the present invention;

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale.

Figure 1A:
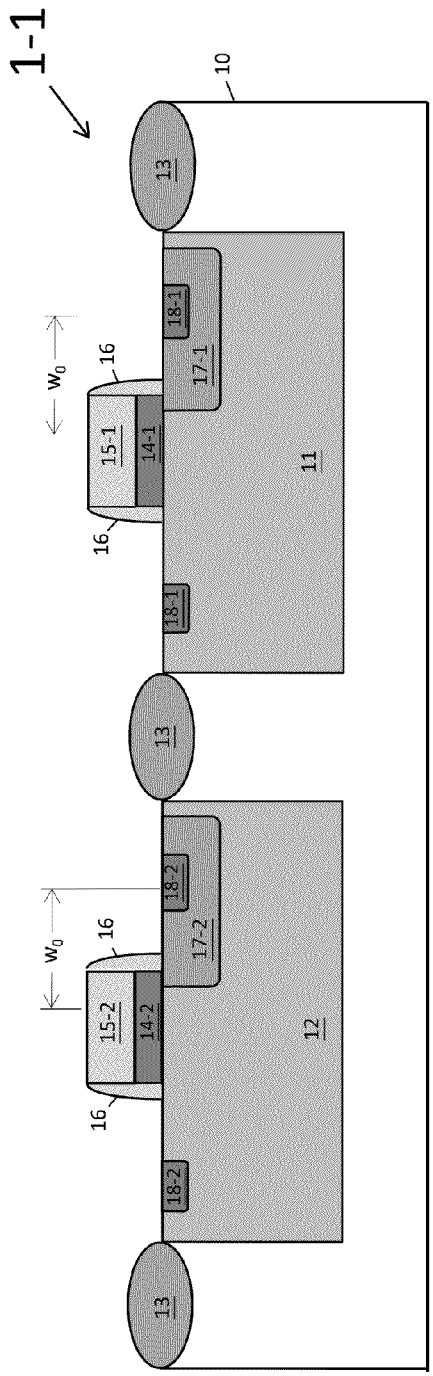
FIGS. 1A and 1B are schematic cross-sectional views illustrating a metal-oxide-semiconductor (MOS) device in prior art.
Figure 1B:
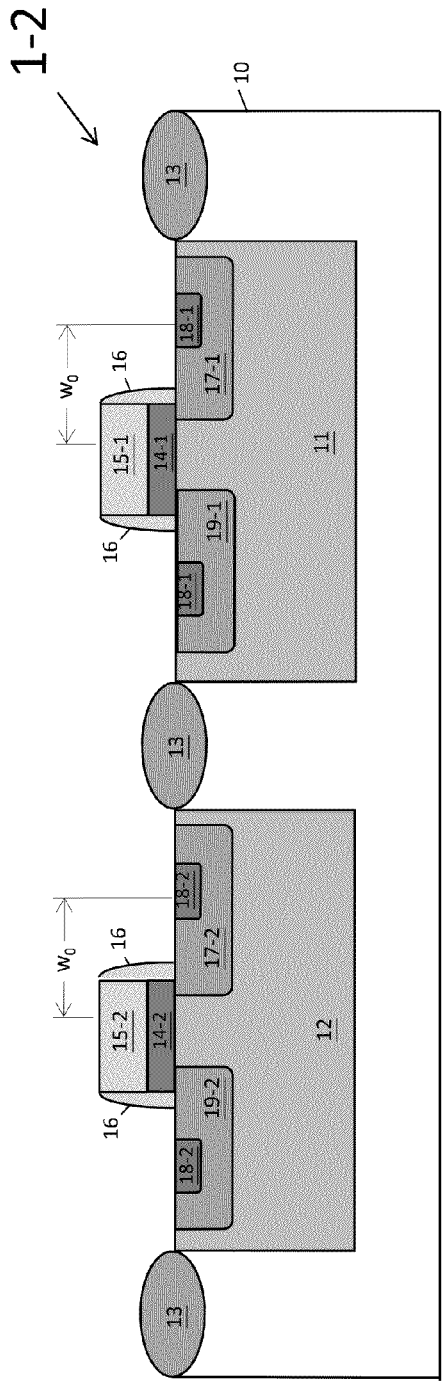
Figure 2A:
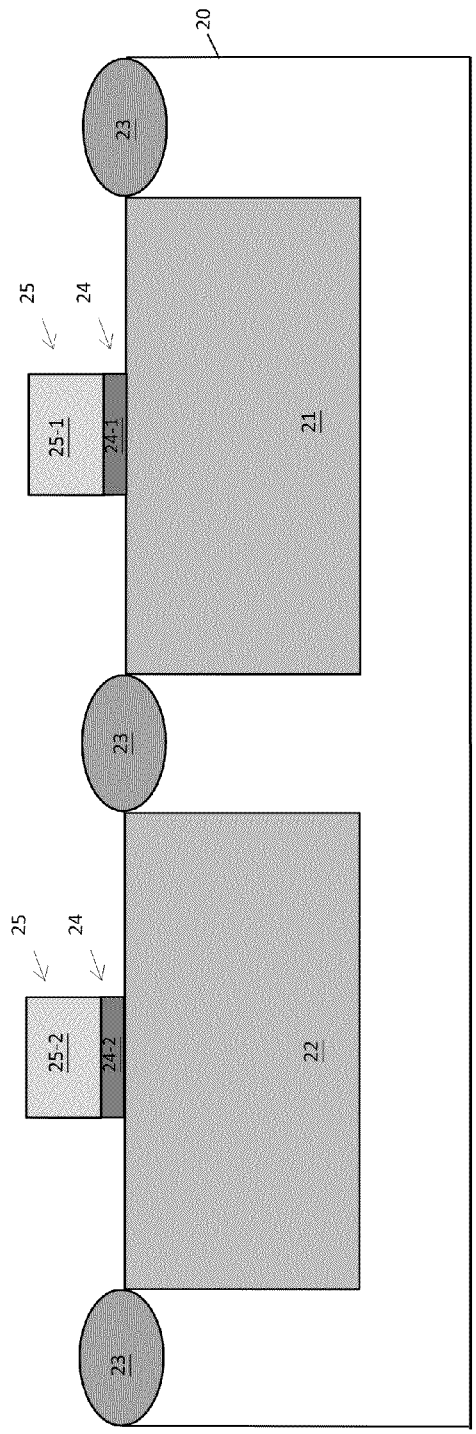
FIGS. 2A to 2D are schematic cross-sectional views illustrating a method of fabricating a double diffused drain (DDD) MOS device in accordance with an example of the present invention.

FIGS. 2A to 2D are schematic cross-sectional views illustrating a method of fabricating a double diffused drain (DDD) MOS device in accordance with an example of the present invention. Referring to FIG. 2A, a substrate 20 may be provided. A plurality of first isolation structures 23 may be formed on the substrate 20. In one example, the isolation structures 23 may include but are not limited to silicon oxide such as silicon dioxide ($SiO_2$). Moreover, the isolation structures 23 may include field oxide (FOX) structures, which may be grown on the substrate 20 by an oxidation process. Alternatively, the isolation structures 23 may include shallow trench isolation (STI) structures, which may be formed by a lithography process and an etching process followed by an oxidation process.

The substrate 20 may then be implanted with a first impurity, such as an n-type impurity having a concentration of approximately $10^{12}$ $cm^{-3}$ (the substrate 20 has been previously doped with a second impurity, such as a p-type impurity.) The implanted first impurity may be diffused to a desired depth, forming a first diffused region, i.e., an n-well region 21 in the substrate 20. Likewise, the substrate 20 may be implanted with the second impurity having a concentration of approximately $10^{12}$ $cm^{-3}$. The implanted second impurity may be diffused, forming a second diffused region, i.e., a p-well region 22 in the substrate 20.

Next, a first dielectric layer (not shown) may be formed on the substrate 20 by a oxidation process. Subsequently, a first conductive layer (not shown) may be formed on the first dielectric layer by another deposition process. Afterwards, a patterned first conductive layer 25 may be formed by an etch process, and then a patterned first dielectric layer 24 may be formed, using the patterned first dielectric layer 25 as a mask. In one example according to the present invention, the patterned first dielectric layer 24 may include silicon oxide such as $SiO_2$. Moreover, the patterned first conductive layer 25 may include a stack structure further including a tungsten silicon (WSi) layer stacked on a poly-silicon layer. The patterned first conductive layer 25 may include a first portion 25-1 over the n-well region 21 and a second portion 25-2 over the p-well region 22. The patterned first dielectric layer 24 may include a first portion 24-1 on the n-well region 21 and a second portion 24-2 on the p-well region 22.

Figure 2B:
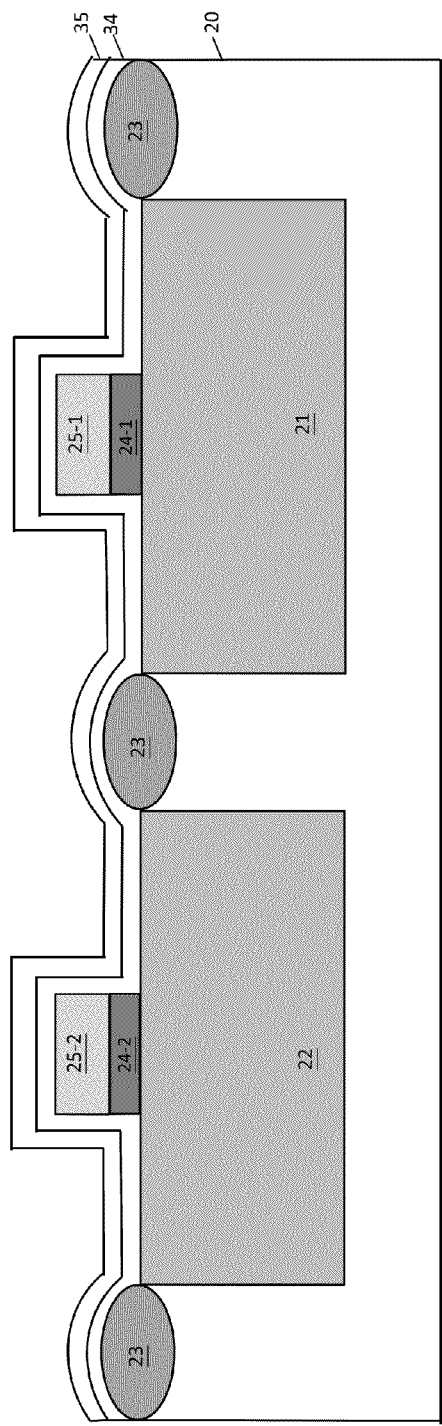

Referring to FIG. 2B, a second dielectric layer 34 may be formed on the patterned first conductive layer 25 and the substrate 20 by a deposition process. In one example, the second dielectric layer 34 may include high temperature oxide (HTO). In other examples, the second dielectric layer 34 may include silicon oxide or silicon nitride. Next, a second conductive layer 35 may be formed on the second dielectric layer 34 by a deposition process. The second conductive layer 35 may include poly-silicon.

Figure 2C:
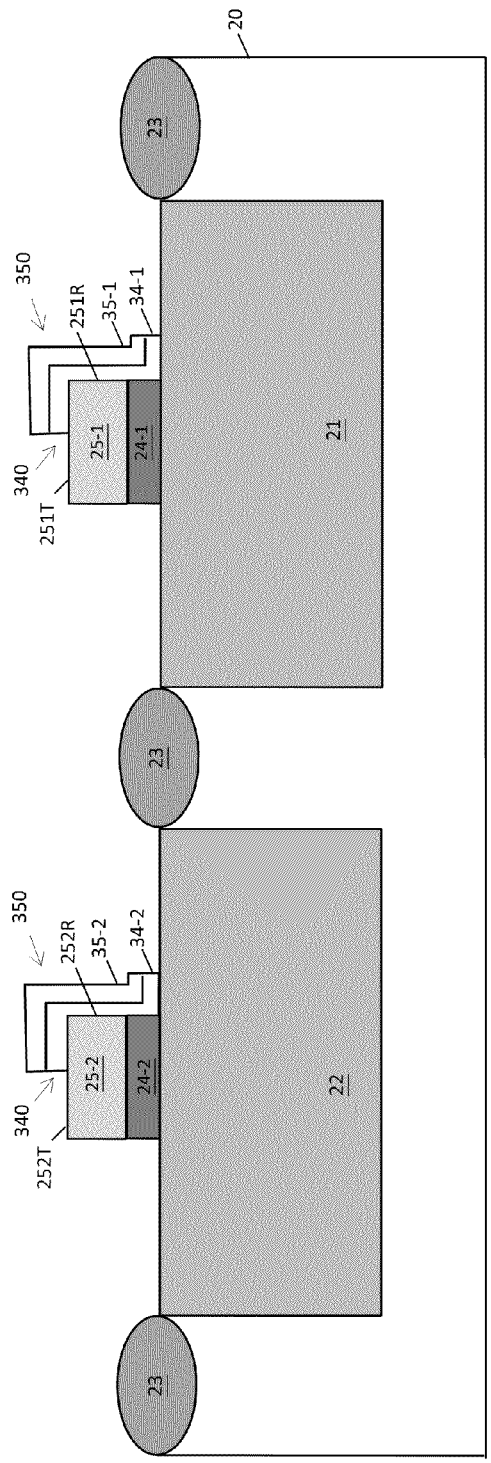

Referring to FIG. 2C, the second conductive layer 35 may be etched to from a patterned second conductive layer 350, which comprises a first portion 35-1 and a second portion 35-2. The second dielectric layer 34 may then be etched using the patterned second conductive layer 350 as a mask, resulting in a patterned second dielectric layer 340, which comprises a first portion 34-1 and a second portion 34-2. The first portion 34-1 of the patterned second dielectric layer 340 may extend on the first portion 25-1 of the patterned first conductive layer 25, covering a portion of an upper surface 251T of the first portion 25-1, and along a sidewall 251R of the first portion 25-1 of the patterned first conductive layer 25 to the substrate 20 and then extend on the substrate 20. Moreover, the first portion 35-1 of the patterned second conductive layer 350 may be positioned on the first portion 34-1 of the patterned second dielectric layer 340.

Likewise, the second portion 34-2 of the patterned second dielectric layer 340 may extend on the second portion 25-2 of the patterned first conductive layer 25, covering a portion of an upper surface 252T of the second portion 25-2, and along a sidewall 252R of the second portion 25-2 of the patterned first conductive layer 25 to the substrate 20, and then extend on the substrate 20. Moreover, the second portion 35-2 of the patterned second conductive layer 350 may be positioned on the second portion 34-2 of the patterned second dielectric layer 340.

Figure 2D:
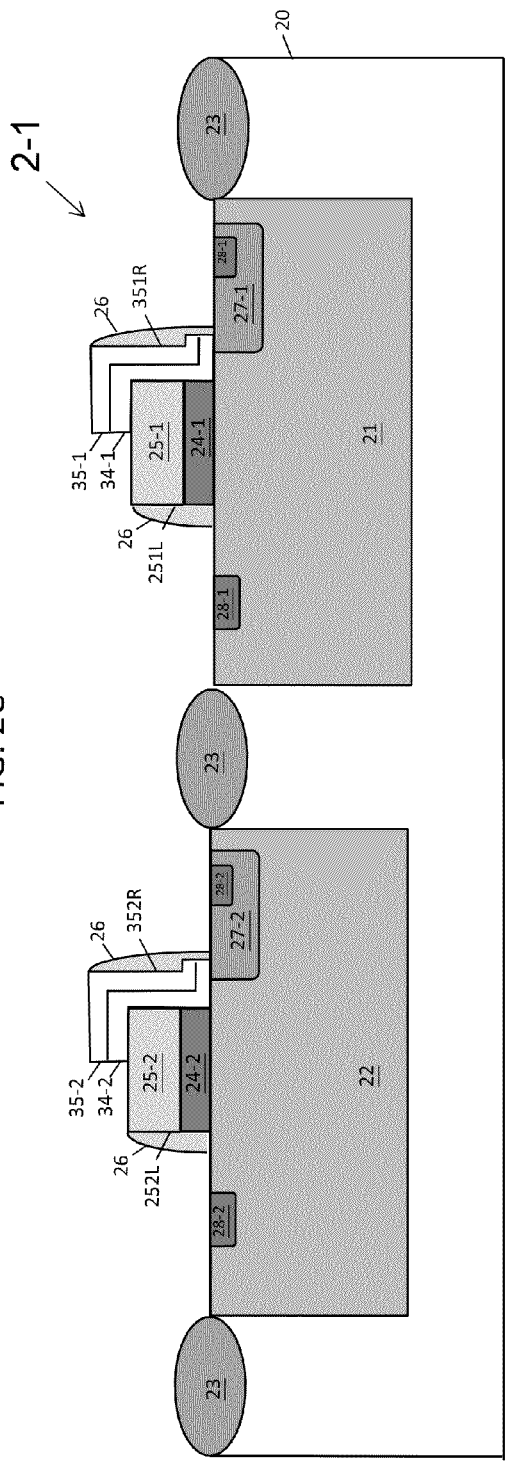

Referring to FIG. 2D, second isolation structures such as spacers 26 may be formed by a deposition process. Specifically, some of the spacers 26 may be formed toward the substrate 20 along sidewalls 351R and 352R of the first portion 35-1 and second portion 35-2, respectively, while the others of the spacers 26 may be formed toward the substrate 20 along sidewalls 251L and 252L of the first portion 25-1 and second portion 25-2, respectively. The second isolation structures 26 in one example may include tetraethyl orthosilicate (TEOS).

Next, a portion of the n-well region 21 may be implanted with the second impurity having a concentration ranging from approximately $10^{12}$ to $10^{13}$ cm$^{-3}$ by an implantation process, resulting in a first implant region 27-1, which may serve as a high voltage "p" minus (HVPM) region. In one example, the first implant region 27-1 may have a depth ranging from approximately 0.4 to 0.6 μm and may overlap the first portion 34-1 of the patterned second dielectric layer 340 and the first portion 35-1 of the patterned second conductive layer 350.

Likewise, a portion of the p-well region 22 may be implanted with the first impurity having a concentration ranging from approximately $10^{12}$ to $10^{13}$ cm$^{-3}$ by an implantation process, resulting in a second implant region 27-2, which may serve as a high voltage "n" minus (HVNM) region. In one example, the second implant region 27-2 may have a depth ranging from approximately 0.4 to 0.6 μm and may overlap the second portion 34-2 of the patterned second dielectric layer 340 and the second portion 35-2 of the patterned second conductive layer 350.

Subsequently, a pair of third implant regions 28-1 with one in the first implant region 27-1 and the other one in the n-well 21 may be formed by an implantation process. In one example, the pair of third implant regions 28-1 has a concentration ranging from approximately $10^{15}$ to $10^{16}$ cm$^{-3}$ and a depth of approximately 0.2 μm. Likewise, a pair of fourth implant regions 28-2 with one in the second implant region 27-2 and the other one in the p-well 22 may be formed. The pair of fourth implant regions 28-2 has a concentration ranging from approximately $10^{15}$ to $10^{16}$ cm$^{-3}$ and a depth of approximately 0.2 μm.

The first portion 35-1 and second portion 35-2 of the patterned second conductive layer 350 may then be doped with the first impurity having a first concentration of approximately $10^{13}$ cm$^{-3}$, resulting in a DDD MOS device 2-1 having an asymmetric structure.

FIG. 3A is a schematic cross-sectional view of a DDD MOS device 3-1 in accordance with an example of the present invention. Referring to FIG. 3A, the MOS device 3-1 may be similar to the MOS device 2-1 described and illustrated with reference to FIG. 2D except that, for example, a first portion 45-1 and a second portion 45-2 of the patterned second conductive layer 350 may replace the first portion 35-1 and a second portion 35-2, respectively, of the patterned second conductive layer 350. Specifically, the first portion 45-1 and the second portion 45-2 of the patterned second conductive layer 350 may be further doped with the first impurity having a second concentration of approximately $10^{14}$ cm$^{-3}$, which is greater than the first concentration, by an implantation process. With the doped first portion 45-1 and second portion 45-2 of the patterned second conductive layer 350, as compared to the MOS device 2-1, the MOS device 3-1 may be more suitable for use in low-resistance applications.

FIG. 3B is a schematic cross-sectional view of a DDD MOS device 3-2 in accordance with another example of the present invention. Referring to FIG. 3B, the MOS device 3-2 may be similar to the MOS device 2-1 described and illustrated with reference to FIG. 2D except that, for example, a patterned second dielectric layer 440 and a patterned second conductive layer 450 may replace the patterned second dielectric layer 340 and the patterned second conductive layer 350, respectively. Specifically, after etching the second conductive layer 35 as illustrated in FIG. 2B, the patterned second conductive layer 450 includes third portions 35-3 over the isolation structures 23 in addition to the first portion 35-1 and second portion 35-2. Furthermore, after etching the second dielectric layer 34 as illustrated in FIG. 2B, the patterned second dielectric layer 440 includes third portions 34-3 on the isolation structures 23 in addition to the first portion 34-1 and second portion 34-2. With the third portions 34-3 and 35-3, as compared to the MOS device 2-1, the MOS device 3-2 may be more suitable for use in high-resistance applications.

Figure 4A:
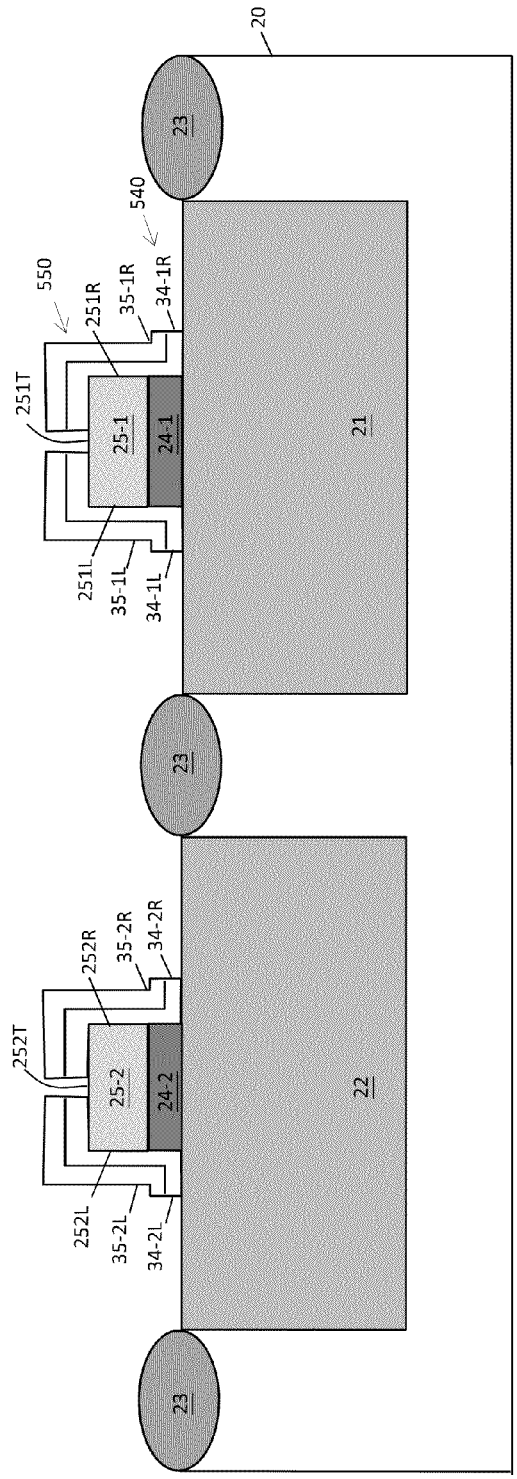
FIGS. 4A and 4B are schematic cross-sectional views illustrating a method of fabricating a DDD MOS device in accordance with another example of the present invention.
Figure 4B:
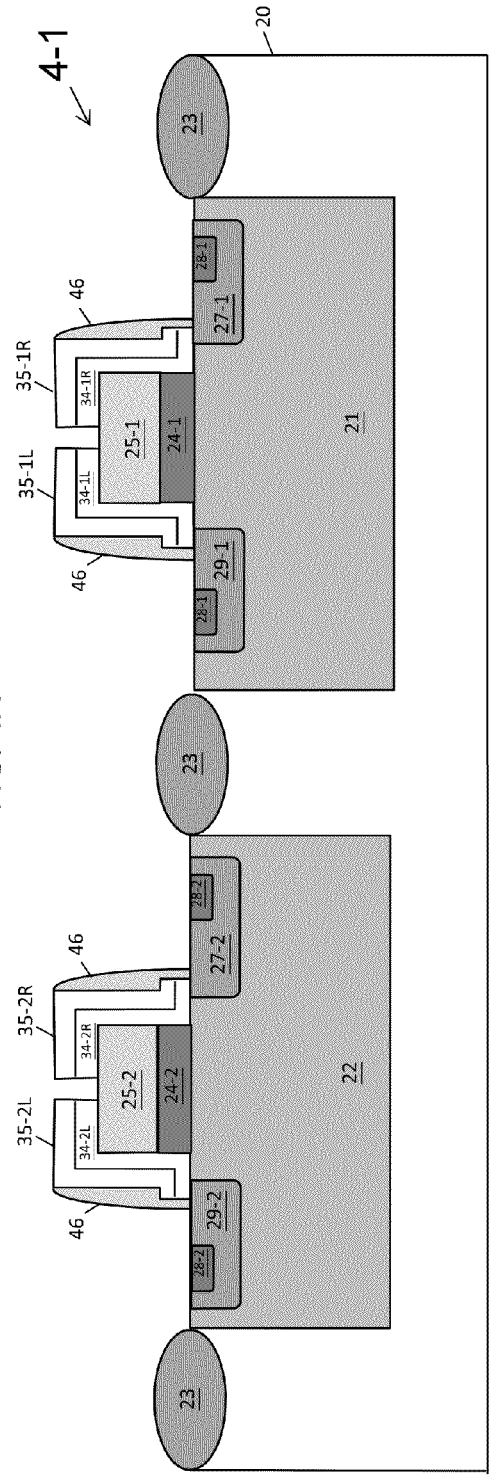

FIGS. 4A and 4B are schematic cross-sectional views illustrating a method of fabricating a DDD MOS device in accordance with another example of the present invention. After the second dielectric layer 34 and the second conductive layer 35 are formed as illustrated in FIG. 2B, referring to FIG. 4A, a patterned second conductive layer 550 may be formed by etching the second conductive layer 35 in an etch process. The patterned second conductive layer 550 may include a pair of first portions 35-1R and 35-1L over the n-well 21 and a pair of second portions 35-2R and 35-2L over the p-well 22.

Next, a patterned second dielectric layer 540 may be formed by etching the second dielectric layer 34 in an etch process, using the patterned second conductive layer 550 as a mask. The patterned second dielectric layer 540 may include a pair of first portions 34-1R and 34-1L over the n-well 21 and a pair of second portions 34-2R and 34-2L over the p-well 22. The first portion 34-1R of the patterned second dielectric layer 540 may extend on the first portion 25-1 of the patterned first conductive layer 25, covering a portion of an upper surface 251T of the first portion 25-1, and along a sidewall 251R of the first portion 25-1 of the patterned first conductive layer 25 to the substrate 20 and then extend on the substrate 20. Moreover, the first portion 35-1R of the patterned second conductive layer 550 may be positioned on the first portion 34-1R of the patterned second dielectric layer 540.

Likewise, the first portion 34-1L of the patterned second dielectric layer 540 may extend on the first portion 25-1 of the patterned first conductive layer 25, covering another portion of the upper surface 251T of the first portion 25-1, and along another sidewall 251L of the first portion 25-1 of the patterned first conductive layer 25 to the substrate 20 and then extend on the substrate 20. The first portions 35-1R and 35-1L may be separated from one another on the upper surface 251T. Moreover, the first portion 35-1L of the patterned second conductive layer 550 may be positioned on the first portion 34-1L of the patterned second dielectric layer 540.

Similarly, the second portion 34-2R of the patterned second dielectric layer 540 may extend on the second portion 25-2 of the patterned first conductive layer 25, covering a portion of an upper surface 252T of the second portion 25-2, and along a sidewall 252R of the second portion 25-2 of the patterned first conductive layer 25 to the substrate 20, and then extend on the substrate 20. Moreover, the second portion 35-2R of the patterned second conductive layer 550 may be positioned on the second portion 34-2R of the patterned second dielectric layer 540.

Likewise, the second portion 34-2L of the patterned second dielectric layer 540 may extend on the second portion 25-2 of the patterned first conductive layer 25, covering another portion of the upper surface 252T of the second portion 25-2, and along another sidewall 252L of the second portion 25-2 of the patterned first conductive layer 25 to the substrate 20, and then extend on the substrate 20. The second portions 35-1R and 35-1L may be separated from one another on the upper surface 252T. Moreover, the second portion 35-2L of the patterned second conductive layer 550 may be positioned on the second portion 34-2L of the patterned second dielectric layer 540.

Referring to FIG. 4B, spacers 46 may be formed along the sidewalls of the patterned first conductive layer 550 and the patterned second dielectric layer 540. Next, a pair of first implant regions 27-1 and 29-1 may be formed in the n-well 21, wherein the first implant region 27-1 may overlap the first portions 34-1R and 35-1R and the other first implant region 29-1, separated from the first implant region 27-1, may overlap the other first portions 34-1L and 35-1L.

Likewise, a pair of second implant regions 27-2 and 29-2 may be formed in the p-well 22, wherein the second implant region 27-2 may overlap the second portions 34-2L and 35-2L and the other second implant region 29-2, separated from the second implant region 27-2, may overlap the other second portions 34-2L and 35-2L.

A pair of third implant regions 28-1 may be formed in the pair of first implant regions 27-1 and 29-1, respectively. Likewise, a pair of fourth implant regions 28-2 may be formed in the pair of second implant regions 27-2 and 29-2, respectively. Subsequently, the pair of first portions 35-1R and 35-1L and the pair of second portions 35-2R and 35-2L of the patterned second conductive layer 550 may then be doped with the first impurity having a first concentration of approximately $10^{13}$ cm$^{-3}$, resulting in a DDD MOS device 4-1 having a symmetric structure.

Figure 5A:
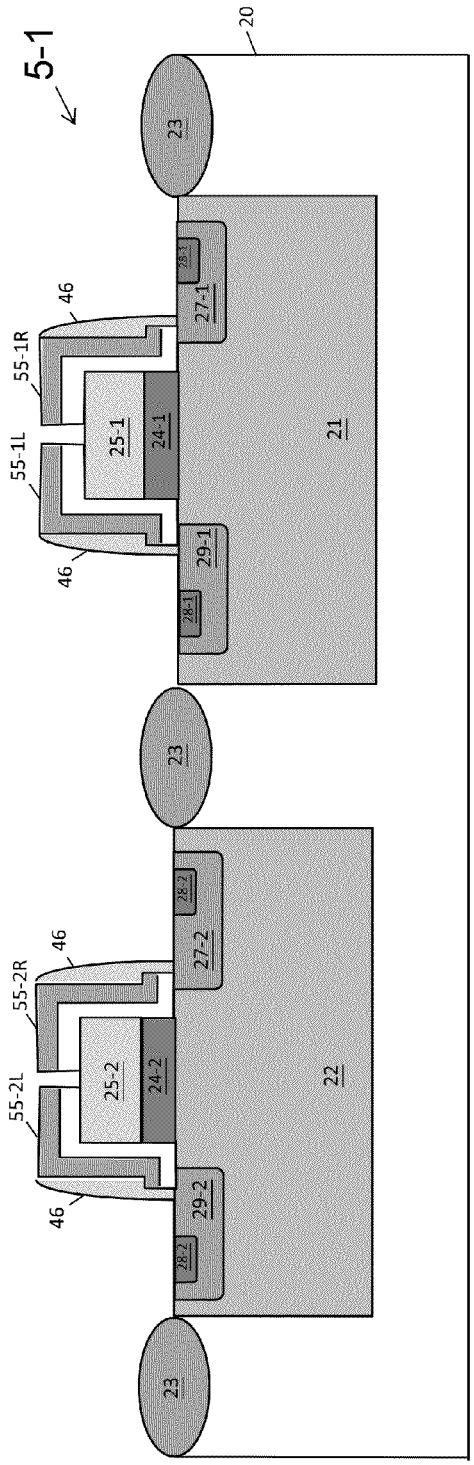
FIG. 5A is a schematic cross-sectional view of a DDD MOS device in accordance with yet another example of the present invention.

FIG. 5A is a schematic cross-sectional view of a DDD MOS device 5-1 in accordance with yet another example of the present invention. Referring to FIG. 5A, the MOS device 5-1 may be similar to the MOS device 4-1 described and illustrated with reference to FIG. 4B except that, for example, first portions 55-1R, 55-1L and second portions 55-2R, 55-2L of the patterned second conductive layer 550 may replace the first portions 35-1R, 35-1L and second portions 35-2R, 35-2L respectively, of the patterned second conductive layer 550. Specifically, the first portions 55-1R, 55-1L and the second portions 55-2R, 55-2L of the patterned second conductive layer 550 may be further doped with the first impurity having a second concentration of approximately $10^{14}$ cm$^{-3}$, which is greater than the first concentration, by an implantation process. With the doped first portions 55-1R, 55-1L and second portions 55-2R, 55-2L of the patterned second conductive layer 550, as compared to the MOS device 4-1, the MOS device 5-1 may be more suitable for use in low-resistance applications.

Figure 5B:
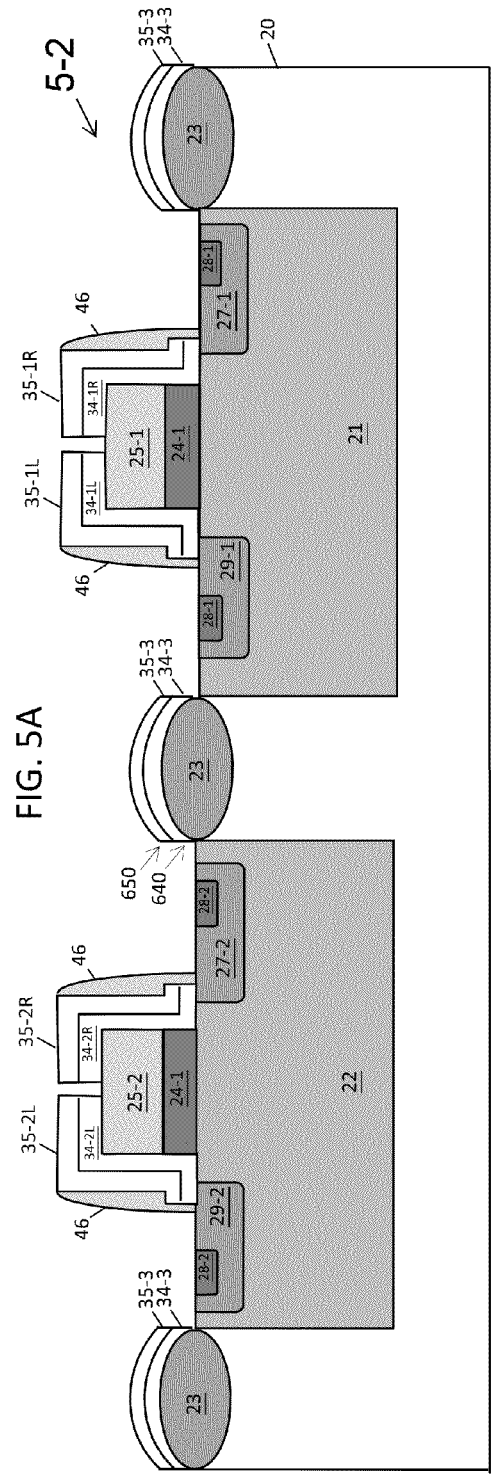
FIG. 5B is a schematic cross-sectional view of a DDD MOS device in accordance with still another example of the present invention.

FIG. 5B is a schematic cross-sectional view of a DDD MOS device 5-2 in accordance with still another example of the present invention. Referring to FIG. 5B, the MOS device 5-2 may be similar to the MOS device 4-1 described and illustrated with reference to FIG. 4B except that, for example, a patterned second dielectric layer 640 and a patterned second conductive layer 650 may replace the patterned second dielectric layer 540 and the patterned second conductive layer 550, respectively. Specifically, after etching the second conductive layer 35 as illustrated in FIG. 2B, the patterned second conductive layer 650 includes third portions 35-3 over the isolation structures 23 in addition to the first portions 35-1R, 35-1L and second portions 35-2R, 35-2L. Furthermore, after etching the second dielectric layer 34 as illustrated in FIG. 2B, the patterned second dielectric layer 640 includes third portions 34-3 on the isolation structures 23 in addition to the first portions 34-1R, 34-1L and second portions 34-2R, 34-2L. With the third portions 34-3 and 35-3, as compared to the MOS device 4-1, the MOS device 5-2 may be more suitable for use in high-resistance applications.

As previously discussed, the impurity concentration in the HVPM region 27-1 and HVNM region 27-2 may be approximately $10^{12}$ to $10^{13}$ cm$^{-3}$. Given such order of concentration, the breakdown voltage (BVD) of a DDD MOS device with an inventive structure according to the present invention may be greater than that of a DDD MOS absent from the structure, while the drain-to-source on-state resistance (Rds$_{ON}$) may have no significant change. If the concentration level increases, for example, to a level higher than $10^{12}$ to $10^{13}$ cm$^{-3}$, the BVD may decrease while Rds$_{ON}$ may also decrease. A DDD MOS device with a lower Rds$_{ON}$ may allow a power management IC to be designed with a larger power. Accordingly, instead of increasing the gate-to-drain distance, by increasing the concentration level, a DDD MOS device according to the present invention may be used in a higher voltage environment.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

That which is claimed:

1. A metal-oxide-semiconductor (MOS) device comprising:
    a diffused region including a first portion of a second impurity type and a second portion of a first impurity type in the substrate;
    a patterned first dielectric layer including a first dielectric portion over the first portion of the diffused region;
    a patterned first conductive layer on the patterned first dielectric layer, the patterned first conductive layer including a first conductive portion on the first dielectric portion;
    a patterned second dielectric layer including a second dielectric portion directly formed on a first portion of an upper surface of the first conductive portion and along a sidewall of the first conductive portion to the substrate;
    a patterned second conductive layer on the patterned second dielectric layer, the patterned second conductive layer including a second conductive portion on the second dielectric portion;
    at least a spacer is formed along at least a sidewall of the patterned first conductive layer and the patterned second dielectric layer; and
    isolation structures on the substrate,
    wherein the patterned second dielectric layer and the at least a spacer are used to sustain high operating voltage of the MOS, and
    wherein the patterned second dielectric layer includes a third dielectric portion that extends on a second portion of the upper surface of the first conductive portion, the second dielectric portion and the third dielectric portion being separated from each other on the upper surface.

2. The MOS device of claim 1 further comprising a first implant region of the second impurity type in the first portion of the diffused region, the first implant region overlapping the second dielectric portion and the second conductive portion.

3. The MOS device of claim 1 further comprising a second implant region of the second impurity type in the first portion of the diffused region, the second implant region overlapping the third dielectric portion.

4. The MOS device of claim 1 further comprising isolation structures on the substrate, wherein the patterned second dielectric layer includes fourth dielectric portions on the isolation structures.

5. The MOS device of claim 1, wherein the patterned second conductive layer includes first impurities of the first impurity type having a first concentration.

6. The MOS device of claim 5, wherein the patterned second conductive layer includes first impurities of the first impurity type having a second concentration, the second concentration being greater than the first concentration.

7. The MOS device of claim 1, wherein the patterned first dielectric layer includes a third dielectric portion over the second portion of the diffused region, the patterned first conductive layer includes a third conductive portion on the third dielectric portion, and the patterned second dielectric layer includes a fourth dielectric portion that extends on a first portion of an upper surface of the third conductive portion and along a sidewall of the third conductive portion to the substrate.

8. The MOS device of claim 7, wherein the patterned second conductive layer includes a fourth conductive portion on the fourth dielectric portion, further comprising a second implant region of the first impurity type in the second portion of the diffused region, the second implant region overlapping the fourth dielectric portion.

9. A metal-oxide-semiconductor (MOS) device comprising:
   a diffused region including a first portion of a second impurity type and a second portion of a first impurity type in the substrate;
   a patterned first dielectric layer including a first dielectric portion over the first portion of the diffused region;
   a patterned first conductive layer on the patterned first dielectric layer, the patterned first conductive layer including a first conductive portion on the first dielectric portion;
   a patterned second dielectric layer including a second dielectric portion directly formed on a first portion of an upper surface of the first conductive portion and along a sidewall of the first conductive portion to the substrate;
   a patterned second conductive layer on the patterned second dielectric layer, the patterned second conductive layer including a second conductive portion on the second dielectric portion, a patterned second dielectric layer and a patterned second conductive layer directly formed on the upper surface of a portion of the patterned first conductive layer, the patterned second conductive layer is formed on the patterned second dielectric layer;
   at least a spacer is formed along at least a sidewall of the patterned first conductive layer and the patterned second dielectric layer; and
   isolation structures on the substrate,
   wherein the patterned second dielectric layer and the at least a spacer are used to sustain high operating voltage of the MOS, and
   wherein the patterned second dielectric layer includes a third dielectric portion that extends on a second portion of the upper surface of the first conductive portion, the second dielectric portion and the third dielectric portion being separated from each other on the upper surface.

10. The MOS device of claim 9 further comprising a first implant region of the second impurity type in the first portion of the diffused region, the first implant region overlapping the second dielectric portion and the second conductive portion.

11. The MOS device of claim 9 further comprising a second implant region of the second impurity type in the first portion of the diffused region, the second implant region overlapping the third dielectric portion.

12. The MOS device of claim 9 further comprising isolation structures on the substrate, wherein the patterned second dielectric layer includes fourth dielectric portions on the isolation structures.

13. The MOS device of claim 9, wherein the patterned second conductive layer includes first impurities of the first impurity type having a first concentration.

14. The MOS device of claim 13, wherein the patterned second conductive layer includes first impurities of the first impurity type having a second concentration, the second concentration being greater than the first concentration.

15. The MOS device of claim 9, wherein the patterned first dielectric layer includes a third dielectric portion over the second portion of the diffused region, the patterned first conductive layer includes a third conductive portion on the third dielectric portion, and the patterned second dielectric layer includes a fourth dielectric portion that extends on a first portion of an upper surface of the third conductive portion and along a sidewall of the third conductive portion to the substrate.

16. The MOS device of claim 15, wherein the patterned second conductive layer includes a fourth conductive portion on the fourth dielectric portion, further comprising a second implant region of the first impurity type in the second portion of the diffused region, the second implant region overlapping the fourth dielectric portion.

* * * * *